United States Patent
Kishimoto (10) Patent No.: US 10,950,682 B2
(45) Date of Patent: Mar. 16, 2021

(54) METHOD FOR MANUFACTURING ORGANIC ELECTROLUMINESCENT DEVICE

(71) Applicant: SAKAI DISPLAY PRODUCTS CORPORATION, Sakai (JP)

(72) Inventor: Katsuhiko Kishimoto, Sakai (JP)

(73) Assignee: SAKAI DISPLAY PRODUCTS CORPORATION, Sakai (JP)

( * ) Notice: Subject to any disclaimer, the term of this patent is extended or adjusted under 35 U.S.C. 154(b) by 0 days.

(21) Appl. No.: 16/610,622

(22) PCT Filed: Nov. 29, 2017

(86) PCT No.: PCT/JP2017/042913
§ 371 (c)(1),
(2) Date: Mar. 25, 2020

(87) PCT Pub. No.: WO2019/106770
PCT Pub. Date: Jun. 6, 2019

(65) Prior Publication Data
US 2020/0235335 A1   Jul. 23, 2020

(51) Int. Cl.
*H01L 21/00*     (2006.01)
*H01L 33/00*     (2010.01)
(Continued)

(52) U.S. Cl.
CPC .......... *H01L 27/3276* (2013.01); *H01L 22/20* (2013.01); *H01L 27/3246* (2013.01); *H01L 51/5256* (2013.01)

(58) Field of Classification Search
CPC ............................ H01L 22/20; H01L 51/5256
(Continued)

(56) References Cited

U.S. PATENT DOCUMENTS 10,505,150 B2 * 12/2019  Kishimoto .......... H01L 51/5256
10,522,784 B2 * 12/2019  Kishimoto ................ B05C 9/12
(Continued)

FOREIGN PATENT DOCUMENTS

JP    2007-250370 A    9/2007
JP    2013-247021 A    12/2013
(Continued)

*Primary Examiner* — Calvin Lee
(74) *Attorney, Agent, or Firm* — ScienBiziP, P.C.

(57) ABSTRACT

A method for manufacturing an organic EL device according to an embodiment of the present invention includes: a step for preparing an element substrate having a substrate and a plurality of organic electroluminescent elements (3) which are supported by the substrate; and a step for forming a thin film encapsulation structure (10) covering the organic electroluminescent elements. The step for forming a thin film encapsulation structure includes: a step A for forming a first inorganic barrier layer (12); after the step A, a step B for detecting particles (P) below or above the first inorganic barrier layer (12) and obtaining positional information on each particle; a step C in which microscopic liquid drops of a coating liquid containing a photocurable resin are applied for each particle by an inkjet method on the basis of the positional information; after the step C, a step D for irradiating the photocurable resin with an ultraviolet ray and curing the photocurable resin to form an organic barrier layer (14); and after the step D, a step E for forming a second inorganic barrier layer (16) on the first inorganic barrier layer and the organic barrier layer.

5 Claims, 6 Drawing Sheets

(51) Int. Cl.
    *H01L 27/32*     (2006.01)
    *H01L 21/66*     (2006.01)
    *H01L 51/52*     (2006.01)

(58) Field of Classification Search
    USPC .............................. 257/98–100; 438/25, 64
    See application file for complete search history.

(56) References Cited

U.S. PATENT DOCUMENTS

| | | | |
|---|---|---|---|
| 10,637,003 B2 * | 4/2020 | Kishimoto | H01L 27/3246 |
| 10,637,009 B1 * | 4/2020 | Kishimoto | H05B 33/22 |
| 10,665,817 B2 * | 5/2020 | Kishimoto | H05B 33/04 |
| 10,720,603 B2 * | 7/2020 | Kishimoto | H01L 27/32 |
| 2014/0049923 A1 | 2/2014 | Ma et al. | |
| 2014/0225089 A1 | 8/2014 | Kato et al. | |
| 2016/0043346 A1 | 2/2016 | Kamiya et al. | |
| 2016/0126495 A1 | 5/2016 | Oka et al. | |
| 2017/0250380 A1 | 8/2017 | Kato | |

FOREIGN PATENT DOCUMENTS

| | | | | |
|---|---|---|---|---|
| JP | 2014-154450 A | | 8/2014 | |
| JP | 2015-176717 A | | 10/2015 | |
| JP | 2015-220001 | * | 12/2015 | ............. H05B 33/04 |
| JP | 2016-039120 A | | 3/2016 | |
| JP | 2016-105052 A | | 6/2016 | |
| JP | 2017-151313 A | | 8/2017 | |
| WO | 2014/196137 A1 | | 12/2014 | |

* cited by examiner

METHOD FOR MANUFACTURING ORGANIC ELECTROLUMINESCENT DEVICE

This application is a Division of U.S. patent application Ser. No. 16/748,110, dated Jan. 21, 2020, now U.S. Pat. No. 10,637,009 issued Apr. 28, 2020; which is a Continuation of U.S. patent application Ser. No. 16/689,502, dated Nov. 20, 2019, now U.S. Pat. No. 10,665,817 issued May 26, 2020; which is a Continuation of U.S. patent application Ser. No. 16/468,415, dated Jun. 11, 2019, now U.S. Pat. No. 10,720,603 issued Jul. 21, 2020; which is a Division of U.S. patent application Ser. No. 16/295,907, dated Mar. 7, 2019, now U.S. Pat. No. 10,505,150 issued Dec. 10, 2019; which is a Continuation of U.S. patent application Ser. No. 15/750,609, dated Sep. 18, 2018, now U.S. Pat. No. 10,522,784 issued Dec. 31, 2019; which is a Continuation of U.S. patent application No. 15/756,858, dated Sep. 13, 2018, now U.S. Pat. No. 10,276,830 issued Apr. 30, 2019; which is a Continuation of U.S. patent application Ser. No. 16/072,267, dated Jul. 24, 2018, now U.S. Pat. No. 10,637,003 issued Apr. 28, 2020; which is a Continuation of U.S. patent application Ser. No. 15/780,298, dated May 31, 2018, now U.S. Pat. No. 10,581,028 issued Mar. 3, 2020; which claims priority to PCT/JP2017/042913, filed Nov. 29, 2017, the disclosures of which are hereby incorporated by references herein in their entirety.

TECHNICAL FIELD

The present invention relates to a method for producing an organic EL device (e.g., an organic EL display device and an organic EL illumination device) and to an organic EL device.

BACKGROUND ART

Organic EL (Electroluminescent) display devices start being put into practical use. One feature of an organic EL display device is flexibility thereof. Such an organic EL display device includes, in each of pixels, at least one organic EL element (Organic Light Emitting Diode: OLED) and at least one TFT (Thin Film Transistor) controlling an electric current to be supplied to each of the at least one OLED. Hereinafter, an organic EL display device will be referred to as an "OLED display device". Such an OLED display device including a switching element such as a TFT or the like in each of OLEDs is called an "active matrix OLED display device". A substrate including the TFTs and the OLEDs will be referred to as an "element substrate".

An OLED (especially, an organic light emitting layer and a cathode electrode material) is easily influenced by moisture to be deteriorated and to cause display unevenness. One technology developed to provide an encapsulation structure that protects the OLED against moisture while not spoiling the flexibility of the OLED display device is a thin film encapsulation (TFE) technology. According to the thin film encapsulation technology, an inorganic barrier layer and an organic barrier layer are stacked alternately to allow such thin films to provide a sufficient level of water vapor barrier property. From the point of view of the moisture-resistance reliability of the OLED display device, such a thin film encapsulation structure is typically required to have a WVTR (Water Vapor Transmission Rate) lower than, or equal to, $1\times10^{-4}$ g/m$^2$/day.

A thin film encapsulation structure used in OLED display devices commercially available currently includes an organic barrier layer (polymer barrier layer) having a thickness of about 5 μm to about 20 μm. Such a relatively thick organic barrier layer also has a role of flattening a surface of the element substrate. However, such a thick organic barrier layer involves a problem of limiting the bendability of the OLED display device.

In such a situation, Patent Document No. 1 discloses a thin film encapsulation structure including a first inorganic material layer, a first resin member and a second inorganic material layer provided on the element substrate in this order, with the first inorganic barrier layer being closest to the element substrate. In this thin film encapsulation structure, the first resin member is present locally, more specifically, in the vicinity of a protruding portion of the first inorganic material layer (first inorganic material layer covering a protruding portion). According to Patent Document No. 1, since the first resin member is present locally, more specifically, in the vicinity of the protruding portion, which may not be sufficiently covered with the first inorganic material layer, entrance of moisture or oxygen via the non-covered portion is suppressed. In addition, the first resin member acts as an underlying layer for the second inorganic material layer. Therefore, the second inorganic material layer is properly formed and properly covers a side surface of the first inorganic material layer with an expected thickness. The first resin member is formed as follows. An organic material heated and vaporized to be mist-like is supplied onto an element substrate maintained at a temperature lower than, or equal to, room temperature. The organic material is condensed and put into liquid drops on the substrate. The organic material in the liquid drops moves on the substrate by a capillary action or a surface tension to be present locally, more specifically, at a border between a side surface of the protruding portion of the first inorganic material layer and a surface of the substrate. Then, the organic material is cured to form the first resin member at the border. Patent Document No. 2 also discloses an OLED display device including a similar thin film encapsulation structure.

The thin film encapsulation structure, described in Patent Document No. 1 or 2, that includes the organic barrier layer formed of a resin located locally does not include a thick organic barrier layer. Therefore, the thin film encapsulation structure is considered to improve the bendability of the OLED display device.

CITATION LIST

Patent Literature

Patent Document No. 1: WO2014/196137
Patent Document No. 2: Japanese Laid-Open Patent Publication No. 2016-39120

SUMMARY OF INVENTION

Technical Problem

However, according to the studies made by the present inventor, an organic barrier layer formed by the method described in Patent Document No. 1 or 2 has a problem that a sufficiently high level of moisture-resistance reliability may not be provided. This problem has been found to be caused because water vapor in the air reaches the inside of an active region on the element substrate (the active region may also be referred to as an "element formation region" or a "display region") via the organic barrier layer.

In the case where an organic barrier layer is formed by use of a printing method such as an inkjet method or the like, it is possible to form the organic barrier layer only in an active region on the element substrate (the active region may also be referred to as an "element formation region"or a "display region") but not in a region other than the active region. In this case, along a periphery of the active region (outer to the active region), there is a region where the first inorganic material layer and the second inorganic material layer are in direct contact with each other, and the organic barrier layer is fully enclosed by the first inorganic material layer and the second inorganic material layer and is insulated from the outside of the first inorganic material layer and the second inorganic material layer.

By contrast, according to the method for forming the organic barrier layer described in Patent Document No. 1 or 2, a resin (organic material) is supplied to the entire surface of the element substrate, and the surface tension of the resin, which is in a liquid state, is used to locate the resin locally, more specifically, at the border between the surface of the element substrate and the side surface of the protruding portion on the surface of the element substrate. Therefore, the organic barrier layer may also be formed in a region other than the active region (the region other than the active region may also be, referred to as a "peripheral region"), namely, may also be formed in a terminal region where a plurality of terminals are located and a lead wire region where lead wires extending from the active region to the terminal region are formed. Specifically, the resin is present locally, more specifically, at, for example, the border between side surfaces of the lead wires or side surfaces of the terminals and the, surface of the substrate In this case, an end of a portion, of the organic barrier layer, that is formed along the lead wires is not enclosed by the first inorganic barrier layer or the second inorganic barrier layer, but is exposed to the air (ambient atmosphere).

The organic barrier layer is lower in the water vapor barrier property than the inorganic barrier layer. Therefore, the organic barrier layer formed along the lead wires acts as a rote that leads the water vapor in the air into the active region.

As can be seen, the, method for forming the organic barrier layer described in Patent Document No. 1 or 2 merely uses the surface tension of the resin in a liquid state to locate the organic barrier layer locally. Therefore, there is an undesirable possibility that the organic barrier layer is formed in a region where the organic barrier layer does, not need to be formed, or that by contrast, the organic: barrier layer is not guaranteed to be formed in a region where the organic barrier layer needs to be formed.

In the above, some problems of a thin film encapsulation structure preferably usable for a flexible organic EL display device is described. The thin film encapsulation structure is not limited to being used for an organic EL display device, and is also usable for other types of organic EL devices such as an organic EL illumination device and the like.

The present invention, made to solve the above-described problems, has an object of providing a method for producing an organic EL device that includes a thin film encapsulation structure and is improved in the moisture-resistance reliability, and also such an organic EL device Solution to Problem A method for producing an organic EL device according to an embodiment of the present invention includes the steps of preparing an element substrate including a substrate and a plurality of organic EL elements supported by the substrate; and forming a thin film encapsulation structure covering the plurality of organic EL elements The step of forming the thin film encapsulation structure includes step A of forming a first inorganic barrier layer, step B of, after step A, detecting particles below or above the first inorganic barrier layer and acquiring position information on each of the particles, step C of supplying each of the particles with a microscopic liquid drop of a coating liquid containing photocurable resin by an inkjet method based on the position information, step after step C, irradiating the photocurable resin with ultraviolet rays and thus curing the photocurable resin to form an organic barrier layer, and step E of, after step D, forming a second inorganic barrier layer on the first inorganic barrier layer and the organic barrier layer.

In an embodiment, the coating liquid does not contain a dye or a pigment.

In an embodiment, the coating liquid contains a dye or a pigment.

In an embodiment, the drop has a volume of the order of 1 fL (femtoliter) or smaller than 1 fL (femtoliter).

In an embodiment, the step C is performed by use of an inkjet device, and the inkjet device includes an ultraviolet irradiation deice directing the ultraviolet rays.

In an embodiment, the ultraviolet irradiation device includes an ultraviolet irradiation head, an ultraviolet light source, unit and an optical fiber located between the ultraviolet irradiation head and the ultraviolet light source unit.

In an embodiment, the step D includes the step of partially ashing a photocured resin layer formed by curing the photocurable resin.

An organic EL device according to an embodiment of the present invention includes an element substrate including a plurality of organic EL elements supported by a substrate; and a thin film encapsulation structure formed on the plurality of organic EL elements. The thin film encapsulation structure includes a first inorganic barrier layer, an organic barrier layer including at least one solid portion in contact with a top surface of the first inorganic barrier layer, and a second inorganic barrier layer in contact with the top surface of the first inorganic barrier layer and a top surface of the at least one solid portion of the organic barrier layer. The at east one solid portion is present only in the vicinity of a particle that is present below or above the first inorganic barrier layer.

In an embodiment, where the particle, or a protruding portion formed of the first inorganic barrier layer on the particle, has an equivalent spherical diameter of 2 R when being approximated to a sphere, a portion, of the organic barrier layer, that is formed in the vicinity of the protruding portion has a volume that is at least a half of $(4-\pi)\pi R^3$ and at most 5 times of $(4-\pi)\pi R^3$.

In an embodiment, where the particle, or a protruding portion formed of the first inorganic barrier layer on the particle, has an equivalent spherical diameter of 2 R when being approximated to a sphere, a portion, of the organic barrier layer, that is formed in the vicinity of the protruding portion is present only in a region extending downward a length corresponding to a radius of the protruding portion from a position corresponding to the center of the protruding portion.

Advantageous Effects of Invention

An embodiment according to the present invention provides a method for producing an organic EL device that includes a thin film encapsulation structure including a relatively thin organic barrier layer and is improved in the mass-productivity and the moisture-resistance reliability, and also such an organic EL device.

BRIEF DESCRIPTION OF DRAWINGS

FIG. 3(a) through 3(d) are each a schematic cross-sectional view of the OLED display device 100; FIG. 3(a) is a cross-sectional view taken along line 3A-3A' in FIG. 2, FIG. 3(b) is a cross-sectional view taken along line 3B-3B' in FIG. 2, FIG. 3(c) is a cross-sectional view taken along line 3C-3C' in. FIG. 2, and FIG. 3(d) is a cross-sectional view taken along line 3D-3D' in FIG. 2.

FIG. 7(a) and FIG. 7(b) show schematic views provided to describe a preferred range of volume of an organic barrier layer to be formed in the vicinity of the particle P in an OLED display device according to an embodiment of the present invention.

DESCRIPTION OF EMBODIMENTS

Hereinafter, a method for producing an organic EL device, and an organic EL device produced by the production method, according to an. embodiment. of the present invention will be described with reference to the drawings. Hereinafter, an OLED displays device will be described as an example of the organic EL device. The embodiments according the present invention are not limited to the embodiments described below as examples.

First, with reference to FIG. 1(a) and FIG. 1(b), a basic structure of an OLED display device 100 produced by a production method according to an embodiment of the present invention will be, described. FIG. 1(a) is a schematic partial cross-sectional view of an active region of the OLED display device 100 according to an embodiment of the present invention. FIG. 1(b) is a partial cross-sectional view of a TFE structure 10 formed on an OLED 3.

The OLED display device 100 includes a plurality of pixels, and each of the pixels includes at least one organic EL element (OLED). Herein, a structure corresponding to one OLED will be described for the sake of simplicity.

As shown in FIG. 1(a), the OLED display device 10 includes a flexible substrate (hereinafter, may be referred to simply as a "substrate") 1, a circuit (backplane) 2 formed on the substrate 1 and including a TFT, the OLED 3 formed on the circuit 2, and the TFE structure 10 formed on the OLED 3. The OLED 3 is, for example, of a top emission type. An uppermost portion of the OLED 3 is, for example, an upper electrode or a cap layer (refractive index adjusting layer). An optional polarizing plate 4 is located on the TFE structure 10.

The substrate 1 is, for example, a polyimide film having a thickness of 15 μm. The circuit 2 including the TFT has a thickness for example, 4 μm. The OLED 3 has a thickness of, for example, 1 μm. The TFE structure 10 has a thickness of, for example, less than, or equal to, 1.5 μm.

FIG. 1(b) is a partial cross-sectional view of the TFE structure 10 formed on the OLED 3. A first inorganic barrier layer (e.g., SiN layer) 12 is formed immediately on the OLED 3, an organic barrier layer (e.g., photocured resin layer) 14 is formed on the first inorganic barrier layer 12, and a second inorganic barrier layer (e.g., SiN layer) 16 is formed on the organic barrier layer 14.

As described below, the organic barrier layer 14 is formed only in a discontinuous portion of a portion, of the first inorganic barrier layer 12, that is formed on a particle (microscopic dust particle) (see, for example, FIG. 3(a)), or is formed only in a discontinuous portion at a border between the first inorganic barrier layer 12 and the particle present on the first inorganic barrier layer 12.

The first inorganic barrier layer 12 and the second inorganic barrier layer 16 are each, for example, an SiN layer having a thickness of, for example, 400 nm. The first inorganic barrier layer 12 and the second inorganic barrier layer 16 each have a thickness of 200 nm or greater and 1000 nm or less independently. The thickness of the TFE structure 10 is preferably 400 nm or greater and less than 2 m, and more preferably 400 nm or greater and less than 1.5 m. The thickness of the organic barrier layer 14, which depends on the size the particle, is generally 50 nm or greater and less than 200 nm.

The TFE structure 10 is formed so as to protect the active region (see the active region R1 in FIG. 2) of the OLED display device 100. As described above, the TFE structure 10 includes, in at least the active, region, the first inorganic barrier layer 12, the organic barrier layer 14 and the second inorganic barrier layer 16 in this order, with the, first inorganic barrier layer 12 being closest to the OLED 3. The organic barrier layer (solid portion) 14 is formed only in a discontinuous portion formed by the particle, and the first inorganic barrier layer 12 and the second inorganic barrier layer 16 are in direct contact with each other in the remaining portion. Therefore, the active region is mostly a portion where the first inorganic barrier layer 12 and the second inorganic barrier layer 16 are in direct contact with each other (hereinafter, such a portion may be referred to as an "inorganic barrier layer joint portion"), and the organic barrier layer 14 does not act as a route that leads water vapor in the air into the active region.

With reference to FIG. 2 through FIG. 7, a method for producing an OLED display device, and an OLED display device produced by such a production method, according to an embodiment of the present invention will be described.

Figure 2:
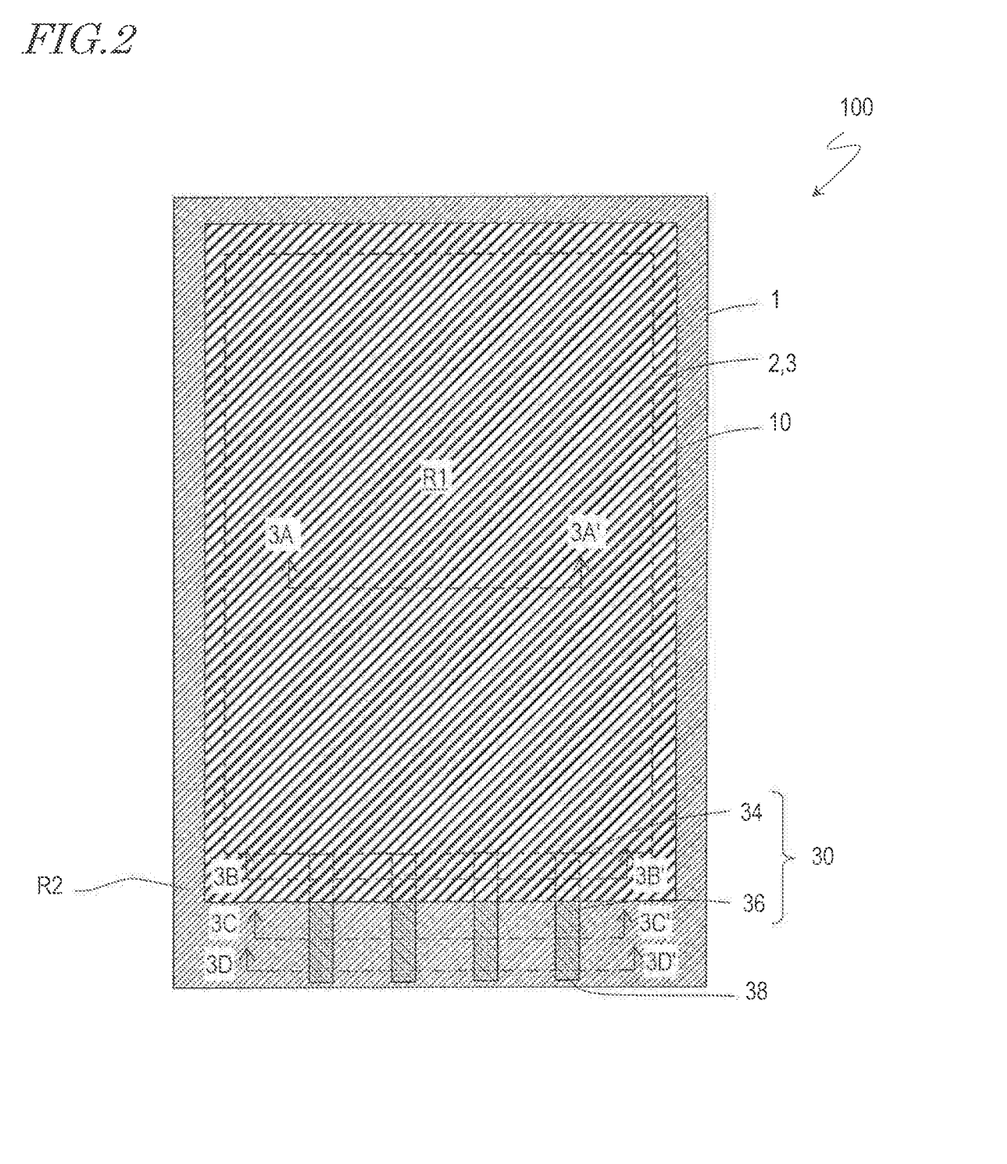
FIG. 2 is a plan view schematically showing a structure of the OLED display device 100 according to an embodiment of the present invention.

FIG. 2 is a schematic plan view of the OLED display device 100 according to an embodiment of the present invention.

Figure 1:
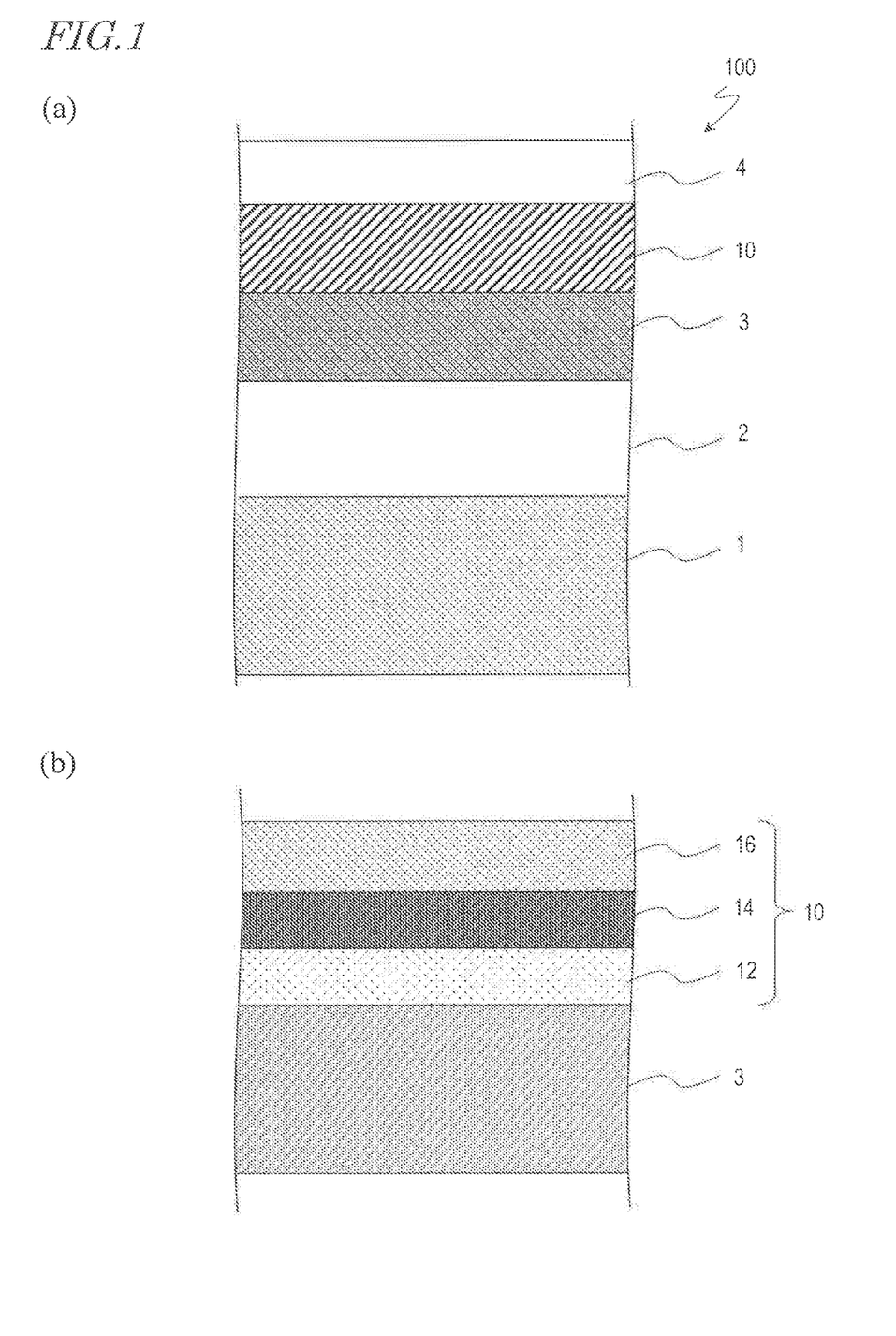
FIG. 1(a) is a schematic partial cross-sectional view of an active region of an OLED display device 100 according to an embodiment of the present invention.
FIG. 1(b) is a partial cross-sectional view of a TFE structure 10 formed on an OLED 3.

The OLED display device 100 includes the flexible substrate 1, the circuit (backplane) 2 formed on the flexible substrate 1, a plurality of the OLEDs 3 formed on the circuit 2, and the TFE structure 10 formed on the OLEDs 3. A layer including the plurality of OLEDs 3 may be referred to as an "OLED layer 3". The circuit 2 and the OLED layer 3 may share a part of components. The optional polarizing plate (see reference sign 4 in FIG. 1) may further be located on the TFE structure 10. In addition, for example, a layer having a touch panel function may be located between the TFE structure 10 and the polarizing plate. Namely, the OLED display device 100 may be altered to a display device including an on-cell type touch panel.

The circuit 2 includes plurality of TFTs (not shown), and a plurality of gate bus lines (not shown) and a plurality of source bus lines (not shown) each connected with either one of the plurality of TFTs (not shown). The circuit 2 may be known circuit that drives the plurality of OLEDs 3. The plurality of LEDs 3 are each connected with either one of the plurality of TFTs included in the circuit 2. The OLEDs 3 may be known OLEDs.

The OLED display device 100 further includes a plurality of terminal portions 38 located in a peripheral region R2 outer to the active region R1 (region enclosed by the dashed line in FIG. 2), where the plurality of OLEDs 3 are located, and also includes a plurality of lead wires 30 connecting each of the plurality of terminal portions 38 and either one of the plurality of gate bus lines or either one of the plurality of source, bus lines to each other. The TFE structure 10 is formed on the plurality of OLEDs 3 and on portions, of the plurality of lead wires 30, that are closer to the active region R1. Namely, the TFE structure 10 covers the entirety of the active region R1 and is also selectively formed on the portions, of the plurality of lead wires 30, that are closer to the active region R1. Neither portions, of the plurality of lead wires 30, that are closer to the terminal portions 38, nor the terminal portions 38, are covered with the TFE structure 10.

Hereinafter, an example in which the lead wires 30 and the terminal portions 38 are integrally formed in the same conductive layer will be described. Alternatively, the lead wires 30 and the terminal portions 38 may be formed in different conductive layers (encompassing stack structures).

Figure 3:
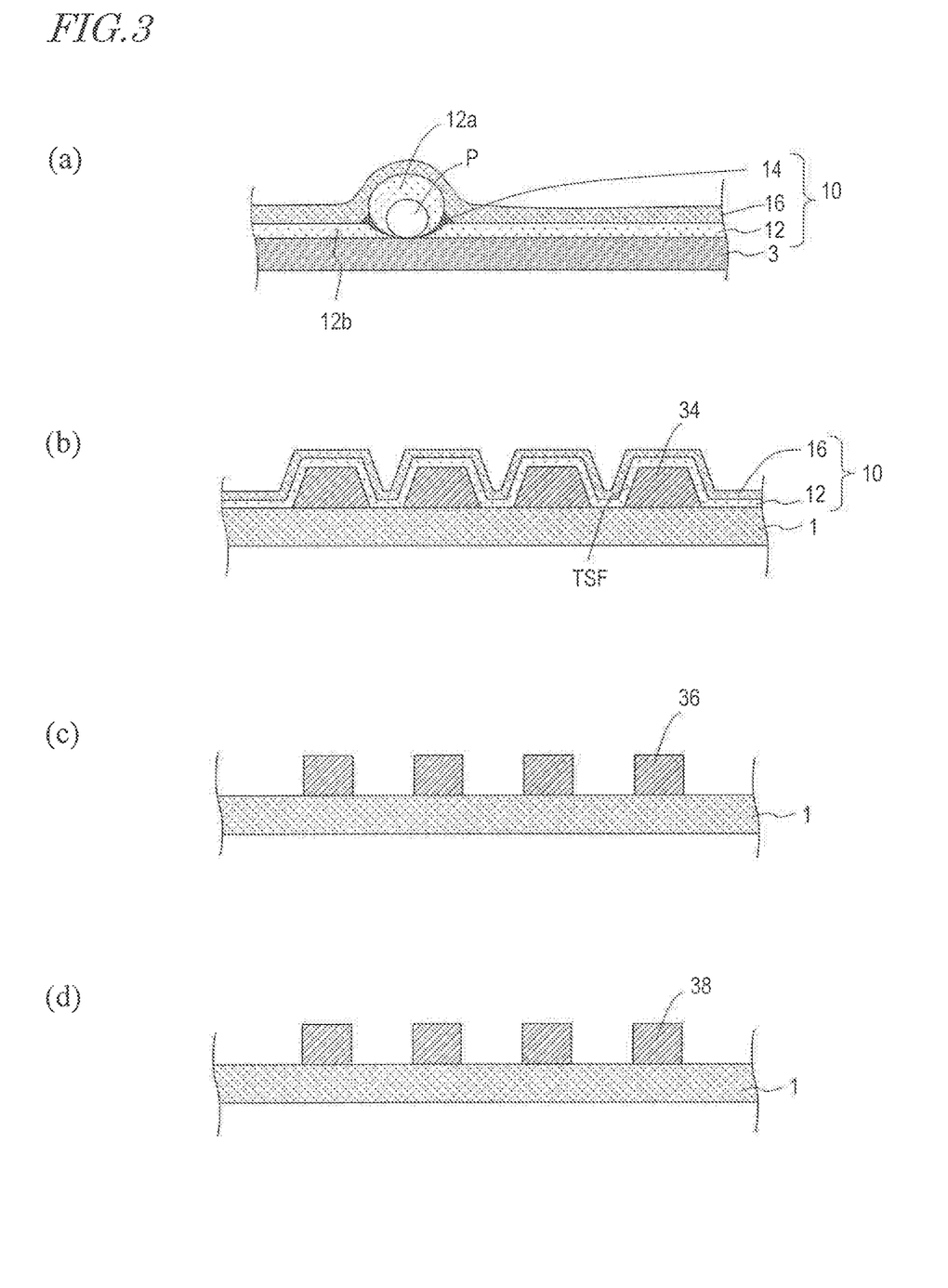

Now, with reference to FIG. 3(*a*) through FIG. 3(*d*), the TFE structure 10 of the OLED display device 100 will be described. FIG. 3(a) is a cross-sectional view taken along line 3A-3A' in FIG. 2. FIG. 3(*b*) is a cross-sectional view taken along line 3B-3B' in FIG. 2. FIG. 3(*c*) is a cross-sectional view taken along line 3C-3C' in FIG. 2. FIG. 3(*d*) is a cross-sectional view taken along line 3D-3D' in FIG. 2.

As shown in FIG. 3(*a*) and FIG. 3(*b*), the TFE structure 10 includes the first inorganic barrier layer 12 formed on the OLED 3, the organic barrier layer 14, and the second inorganic barrier layer 16 in contact with the first. inorganic barrier layer 12 and the organic barrier layer 14. The first inorganic barrier layer 12 and the second inorganic barrier layer 16 are each, for example, an SiN layer, and are selectively formed only in a predetermined region so as to cover the active region R1 by plasma CVD by use of a mask. The organic barrier layer (solid portion) 14 is formed by an inkjet method only in a discontinuous portion formed by the particle.

FIG. 3(*a*) is a cross-sectional view taken along line 3A-3A' in FIG. 2, and shows a portion including a particle P. The particle P is a microscopic dust particle generated during the production of the OLED display device, and is, for example, a microscopic piece of broken glass, a metal particle or an organic particle. Such a particle P is especially easily generated in the case where mask vapor deposition is used.

As shown in, for example, FIG. 3(*a*), the organic barrier layer 14 is formed only in a discontinuous portion formed by the particle P. Namely, the organic barrier layer 14 is not present in a region where the particle P is not present, and the OLED display device including no particle P does not include the organic barrier layer. A particle P having a size (equivalent spherical diameter) of approximately 0.3 m or longer and 5 m or shorter declines the moisture-resistance reliability of the TFE structure 10. It should be noted that a particle P having a size of 0.2 m or longer and shorter than 0.3 m may also decline the moisture-resistance reliability. A particle P having a size shorter than 0.2 m is considered to have substantially no possibility of declining the moisture-resistance reliability. A particle having a size longer than 5 m is removed by cleaning or the like.

A substrate of G4.5 (730 mm×920 mm) may include, for example, several tens to about 100 particles each having a size of approximately 0.3 m or longer and 5 m or shorter. One OLED display device (active region) may include approximately several particles. Needless to say, there, are OLED display devices with no particle P. The organic barrier layer 14 is formed of, for example, a photocured resin formed by curing photocurable resin. A portion where the photocured resin is actually present is referred to as a "solid portion". The organic barrier layer 14 includes at least one solid portion, and may include two or more solid portions.

Figure 4:
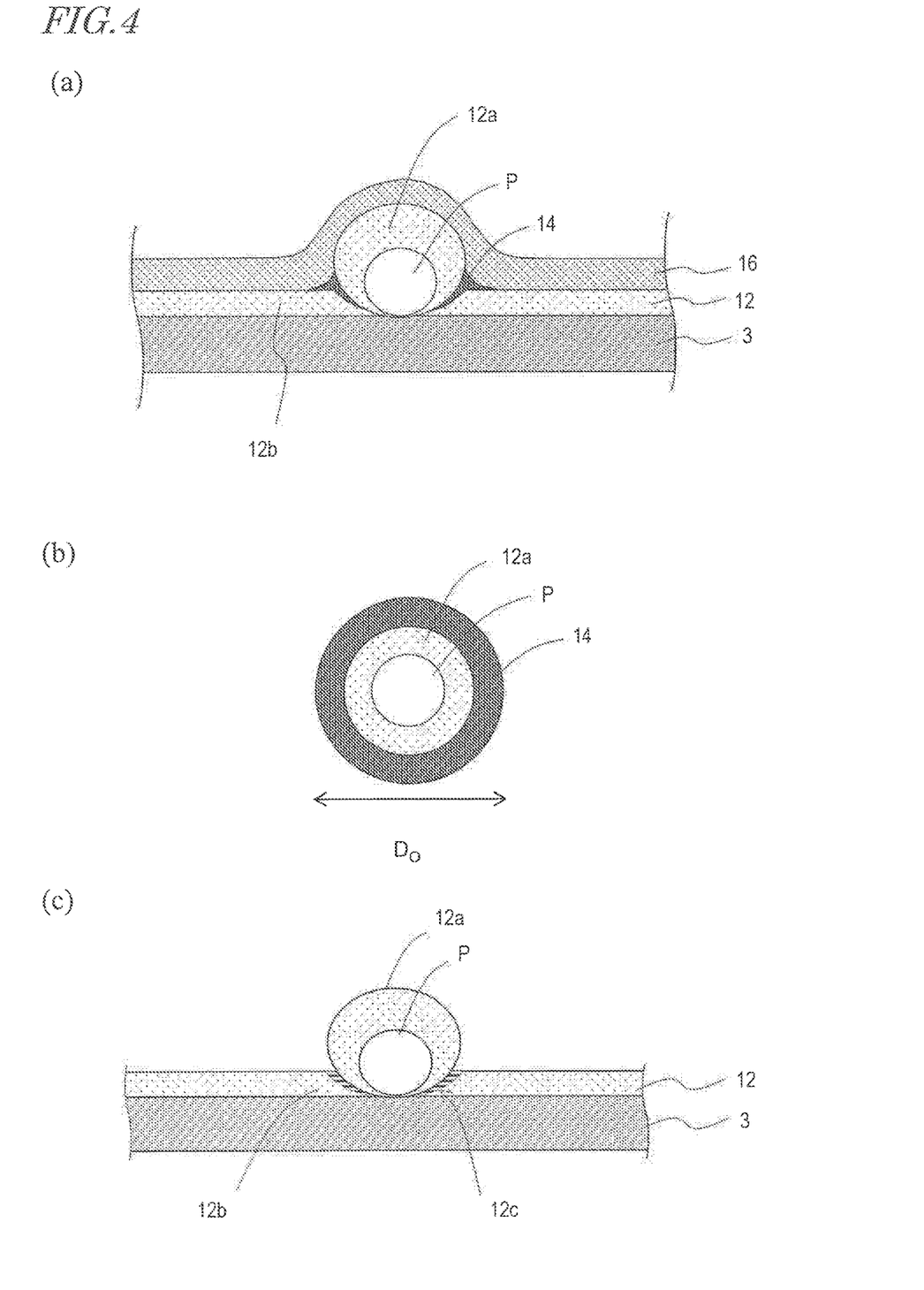
FIG. 4(a) is an enlarged view of a portion including a particle P shown in FIG. 3(a)
FIG. 4(b) is a schematic plan view showing the size relationship among the particle P, a first inorganic barrier layer (SiN layer) covering the particle P, and an organic barrier layer.
FIG. 4(c) is a schematic cross-sectional view of the first inorganic barrier layer covering the particle P.

Now, with reference to FIG. 4(*a*) through FIG. 4(*c*), a structure of the portion including the particle P will be described. FIG. 4(*a*) is an enlarged view of the portion including the particle P shown in FIG. 3(*a*). FIG. 4 (*b*) is a schematic plan view showing the size relationship among the particle P, the first inorganic barrier layer (SiN layer) covering the particle P and the organic barrier layer. FIG. 4(*c*) is a schematic cross-sectional view of the first inorganic barrier layer covering the particle P.

In the TFE structure 10 of the OLED display device 100, as shown in FIG. 4(*a*), the organic barrier layer 14 is formed to fill a crack 12*c* of the first inorganic barrier layer 12, and a surface (concave surface) of the organic barrier layer 14 couples a surface of a first inorganic barrier layer 12*a* on the, particle P and a surface of first inorganic barrier layer 12*b* on a flat portion of the OLED 3 to each other continuously and smoothly. The organic barrier layer 14, which is formed by curing a photocurable resin in a liquid state as described below, has a concave surface formed by a surface tension. In this state, the photocurable resin exhibits a high level of wettability to the first inorganic barrier layer 12. If the level of wettability of the photocurable resin to the first inorganic barrier layer 12 is low, the surface of the organic barrier layer 14 may be convex. The organic barrier layer 14 may also be formed with a small thickness on the surface of the first inorganic barrier layer 12*a* on the particle P.

The organic barrier layer (solid portion) 14 having the concave surface couples the surface of the first inorganic barrier layer 12*a* on the particle P and the surface of the first inorganic barrier layer 12*b* on the flat portion to each other continuously and smoothly. Therefore, the second inorganic barrier layer 16 formed thereon is a fine film with no defect. As can be seen, even if the particle P is present, the organic barrier layer 14 keeps high the level of barrier property of the TFE structure 10.

As shown in FIG. 4(*b*), the organic barrier layer (solid portion) 14 is formed in a ring shape around the particle P. Where the particle P has a diameter (equivalent circle diameter) of about 1 µm as seen in a direction normal to the surface of the OLED 3, the ring-shaped solid portion has a diameter (equivalent circle diameter) $D_0$ that is, example, longer than, or equal to, 2 µm.

In this example, the organic barrier layer 14 is formed only in a discontinuous portion of a portion, of the first inorganic barrier layer 12, that is farmed on the particle P, and the particle P is already present before the first inorganic barrier layer 12 is formed on the OLED 3. Alternatively, the particle P may be present on the first inorganic barrier layer 12. In this case, the organic barrier layer 14 is formed only at the border, namely, in a discontinuous portion, between the first inorganic barrier layer 12 and the particle P present on the first inorganic barrier layer 12, and thus maintains the barrier property of the TFE structure 10 like the, above-described case. organic barrier layer 14 may also be formed with a small thickness on the surface of the first inorganic barrier layer 12a on the, particle P, or on the surface of the particle P. In this specification, the expression that "the organic barrier layer (solid portion) 14 is present in the vicinity of the particle P" encompasses all these forms.

Now, with reference to FIG. 3(b), a structure of the TFE structure 10 on the lead wires 30 will be described. FIG. 3(b) is a cross-sectional view taken along line 3B-3B' in FIG. 2; more specifically, is a cross-sectional view portions 34, of the lead wires 30, closer to the active region R1. Still more specifically, FIG. 3(b) is a cross-sectional view of the portions 34, which each have a forward tapering side, surface portion (inclining side surface portion) TSF having a tapering angle smaller than 90 degrees.

The lead wires 30 are patterned by the same process as that of, for example, the gate bus liner or the source bus lines. Thus, in this example, the gate bus lines and the source bus lines formed in the active region R1 also have the same cross-sectional structure as that of the portion 34, of each of the lead wires 30, closer to the active region R1 shown in FIG. 3(b).

The active region R1 of the OLED display device 100 substantially covered with the inorganic barrier layer joint portion, where the first inorganic barrier layer 12 and the second inorganic barrier layer 16 are in direct contact with each other, except for the portion in the vicinity of the particle P, namely, the portion where the organic barrier layer 14 is selectively formed. Therefore, it does not occur that the organic barrier layer 14 acts as an entrance route for moisture and allows the moisture to reach the active region R1 of the OLED display device.

In the case where the lead wire 30 includes the forward tapering side surface portion TSF, formation of defects in the first inorganic barrier layer 12 and the second inorganic barrier layer 16 formed on the lead wire 30 is prevented. Namely, the moisture-resistance reliability of the TFE structure 10 is improved. The tapering angle of the forward tapering side surface portion TSF is preferably smaller than, or equal to, 70 degrees.

The OLED display device 100 according to an embodiment of the present invention is preferably usable for, for example, medium- to small-sized high-definition smartphones and tablet terminals. In a medium- to small-sized g., 5.7-inch) high-definition (e.g., 500 ppi) OLED display device, it is preferred that lines (encompassing the gate bus lines and the source bus lines) in the active region R1 have a cross-sectional shape, taken in a direction parallel to a line width direction, close to a rectangle (side surfaces of the lines have a tapering angle of about 90 degrees) in order to allow the lines to have a sufficiently low resistance with a limited line, width. In order to form the lines having a low resistance, the tapering angle of the forward tapering side surface portion TSF may be larger than 70 degrees and smaller than 90 degrees, or the tapering angle may be about 90 degrees in the entire length of the lines with no forward tapering side surface portion TSF being provided as long as no defect is formed in the, first inorganic barrier layer 12 or the second inorganic barrier layer 16.

Now, FIG. 3(c) and FIG. 3(d) will be referred to. FIG. 3(c) and FIG. 3(d) are each a cross-sectional view of a region where the TFE structure 10 is not formed. Neither portions 36 of the lead wires 30 shown in FIG. 3(c) nor the terminal portions 38 shown in FIG. 3(d) have no need to include a forward tapering side surface, portion TSF, and therefore, may have a tapering angle of about 90 degrees as shown in the figures.

The organic barrier layer (solid portion) 14 included in the OLED display device 100 according to an embodiment of the present invention is formed only in the vicinity of the particle P by an inkjet method. Therefore, no resin is present locally, more specifically, at a border between the side surfaces of the lead wires or the side surfaces of the terminal portions and the surface of the substrate. For this reason, even if the tapering angle is about 90 degrees, the organic barrier layer (solid portion) is not formed along the lead wires, and the moisture-resistance reliability is not declined by the formation of the organic barrier layer (solid portion) 14.

Now, with reference to FIG. 5 and FIG. 6, a method for producing an OLED display device according to an embodiment of the present invention will be described.

A method for producing an OLED display device according to an embodiment of the present invention includes a step of preparing an element substrate including a substrate and a plurality of organic EL elements supported the substrate, and a step of forming a thin film encapsulation structure covering the plurality of organic EL elements. The step of forming the thin film encapsulation structure includes step A of forming a first inorganic barrier layer; step B of, after step A, detecting particles below or above the first inorganic barrier layer and acquiring position information on each of the particles; step C of supplying each of the particles with a microscopic liquid drop of a coating liquid containing a photocurable resin by an inkjet method based on the acquired position information; step D of, after step C, irradiating the photocurable resin with ultraviolet rays and thus curing the photocurable resin to form an organic barrier layer; and step E of, after step D, forming a second inorganic barrier layer on the first inorganic, barrier layer and the organic barrier layer.

The method for producing an OLED display device according to an embodiment includes a foreign object detection step (step B) and an inkjet step (step C). This allows the OLED display device having the above-described structure to be produced.

Figure 5:
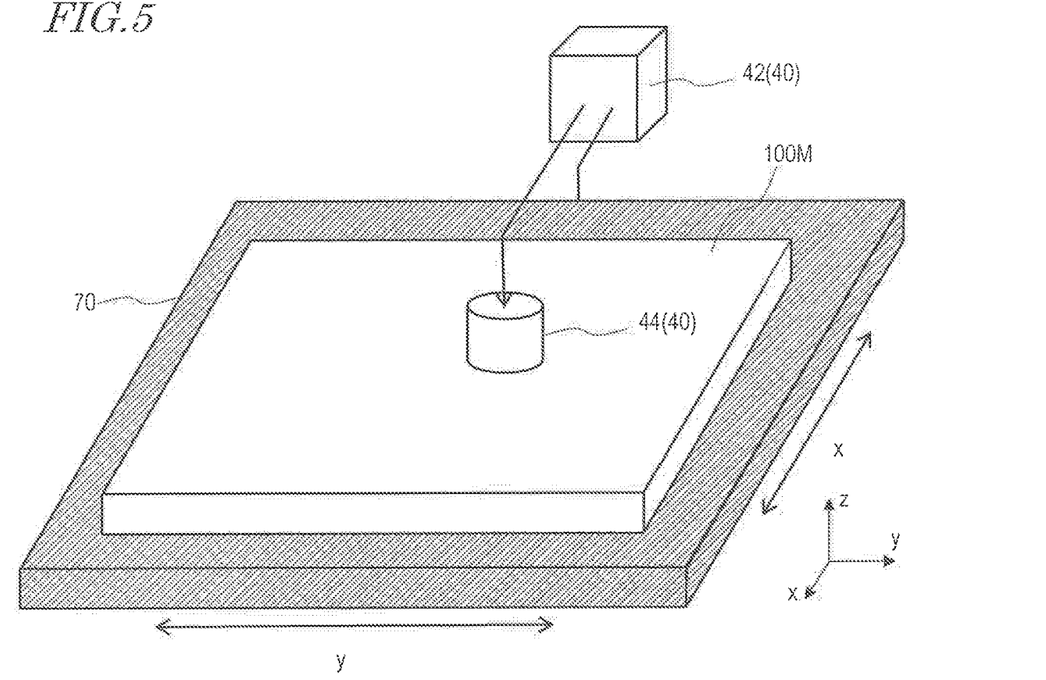
FIG. 5 is a schematic view showing a foreign object detection device 40 usable for a method for producing an OLED display device according to an embodiment of the present invention.

FIG. 5 is a schematic view showing a foreign object detection device 40 usable for the method for producing an OLED display device according to an embodiment of the present invention. FIG. 6 is a schematic view showing an inkjet device 50 usable for the method for producing an OLED display device according to an embodiment of the present invention.

The foreign object detection device 40 shown in FIG. 5 includes a controller 42 and a detection head 44. The controller 42 controls an operation of the detection head 44 and also controls an operation of a stage 70. The stage 70 is capable of receiving a substrate 100M and transporting the substrate 100M in an x-axis direction and a y-axis direction.

The stage 70 is capable of, for example, attracting and securing the substrate 100M, and/or transporting the substrate 100M in a floating state, (contactless transportation). The substrate 100M is an element substrate formed by use G4.5 mother substrate, and includes the components up to the first inorganic barrier layer.

The controller 42 includes a memory and a processor (neither is shown), and controls the detection head 44 and/or the stage 70 to operate in accordance with information stored on the memory, so that the detection head 44 scans on the substrate 100M. A signal that controls the detection head 44 and/or the stage 70 to operate is generated by the processor and supplied to the detection head 44 and/or the stage 70 via an interface (represented by the arrow in the figure).

The detection head 44 includes, for example, a laser light source (e.g., semiconductor laser element), an image-forming optical system, and an image-capturing element (none of these components is shown). Laser light is directed toward a predetermined position on the substrate 100M, and the light scattered by the substrate, 100M is caused, by the image-forming optical system, to form an image on a light receiving surface of the image-capturing element. Regarding the result of image-capturing performed by the image-capturing element, the processor finds whether or not there is a particle, the size of the particle, and the like in accordance with a predetermined algorithm, and stores the obtained results on the memory. Such a foreign object detection device is described in, for example, Japanese Laid-Open Patent. Publication No. 2016-105052. The entirety of the disclosure of Japanese Laid-Open Patent Publication No. 2016-105052 is incorporated herein by reference. As the foreign object detection device 40, for example, HS-930 produced by Toray Engineering Co., Ltd. is preferably usable. HS-930 is capable of detecting a foreign object, having a size of 0.3 m (evaluation performed by scattering standard particles). HS-930 is capable of inspecting, for example, a G4.5 substrate in a time period shorter than 60 seconds.

The standard particle is a true sphere polystyrene latex particle. The actual particle P is a microscopic piece of broken glass, a metal particle or an organic particle (organic EL material), and is covered with an SiN layer (refractive index: about 1.8; second inorganic barrier layer). Therefore, the actual particle P is mote easily detectable than the standard particle. With the above-described foreign object detection device using scattered laser light, a foreign object having an equivalent spherical diameter of 0.2 m or longer is detected.

Figure 6:
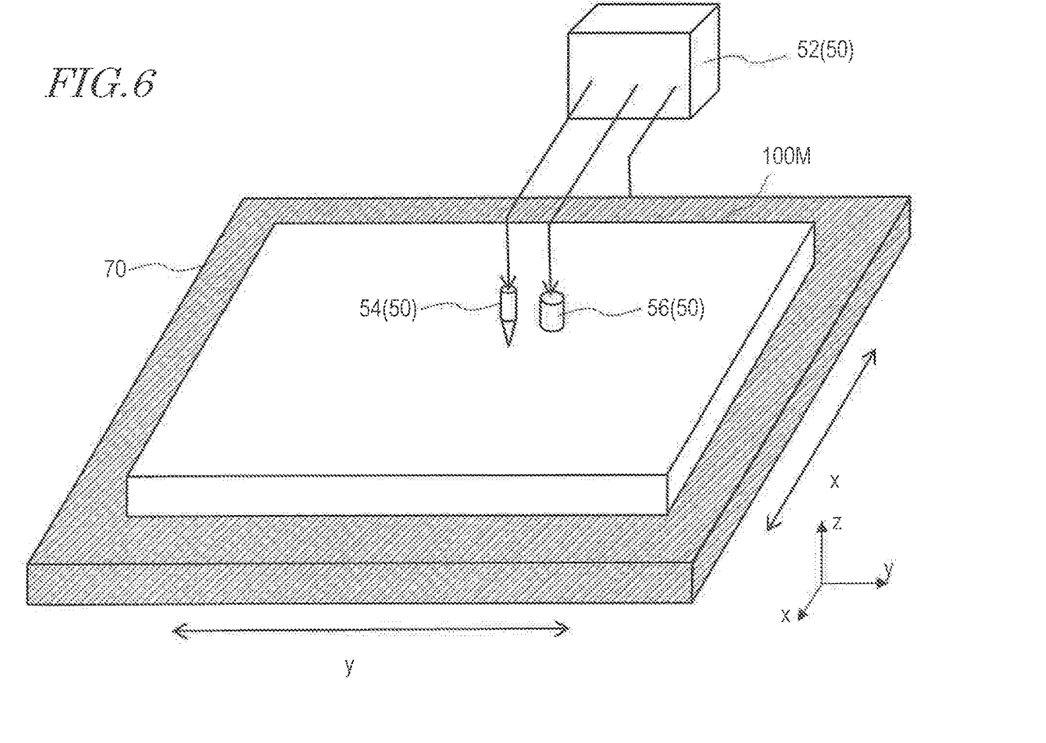
FIG. 6 is a schematic view showing an inkjet device 50 usable for a method for producing an OLED display device according to an embodiment of the present invention.
Figure 7:
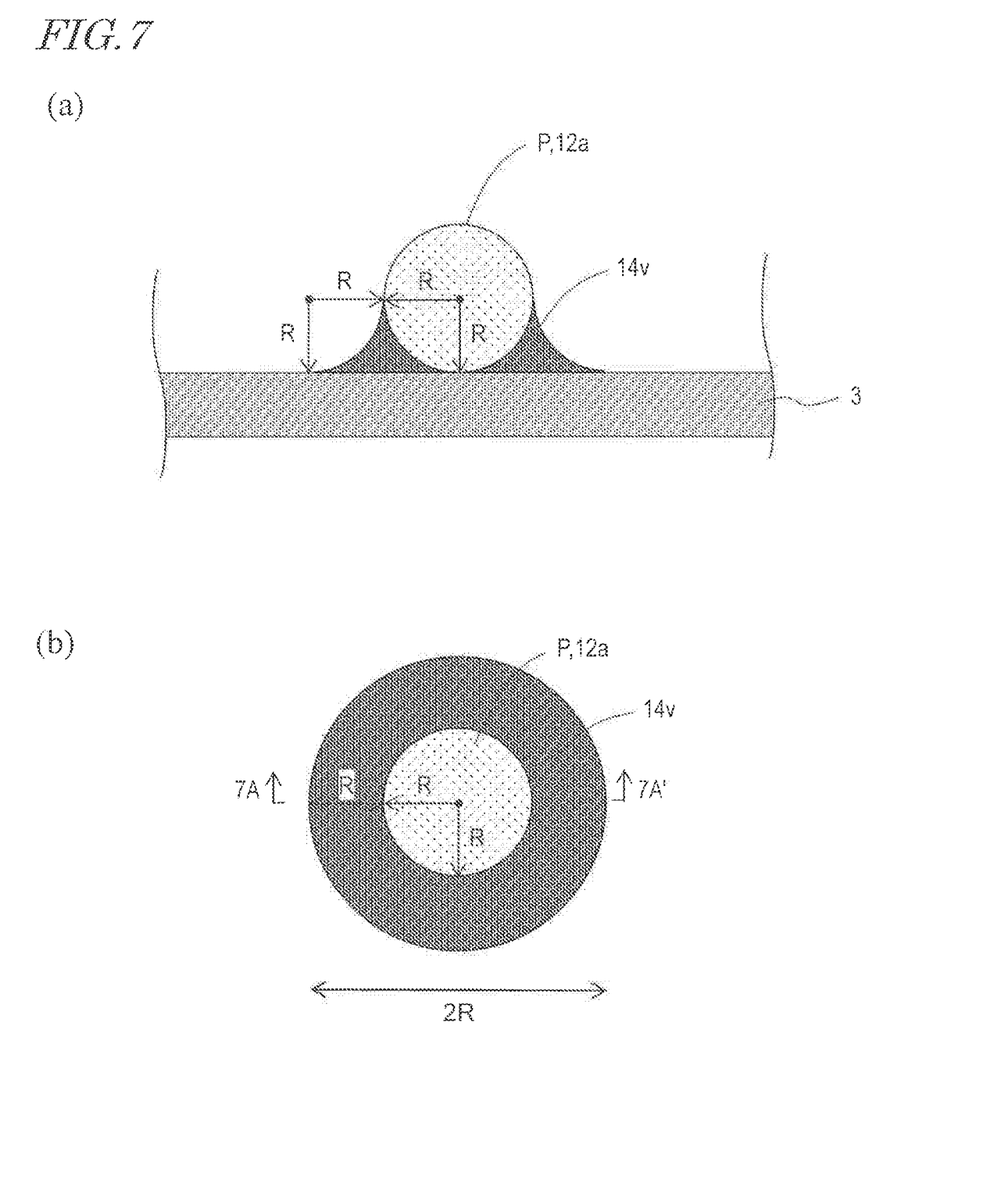
FIG. 7(a) is a schematic view of a cross-section including a diameter of the particle P (cross-section taken along line 7A-7A' in FIG. 7(b))
FIG. 7(b) is a plan view as seen in the normal direction.

The inkjet device 50 shown in FIG. 6 includes a controller 52, an inkjet head 54, and a UV (ultraviolet) irradiation head 56.

The controller 52 includes a memory and a processor (neither is shown), and controls the inkjet head 54, the UV irradiation head 56 and/or the stage 70 to operate in accordance with information stored on the memory, so that the inkjet head 54 and the UV irradiation head 56 move to a desired position on the substrate 100M.

A signal that controls the inkjet head 54, the UV irradiation head 56 and/or the stage 70 to operate is generated by the processor and supplied to the inkjet head 54, the UV irradiation head 56 and/or the stage 70 via interfaces (represented by the arrows in the figure) For example, position information (e.g., xy coordinates), on the position at which the particle is present, stored on the memory of the controller 42 of the foreign object detection device 40 is received by the, controller 52. Based on the position information, microscopic liquid drops of the coating liquid containing the photocurable resin are supplied from the inkjet head 54. The amount of the coating liquid (the number of the microscopic liquid drops, namely, the, number of shots) supplied from the, inkjet head 54 is, for example, found by the processor based on size information on the particle stored on the memory of the controller 42 of the foreign object detection device 40 and received by the controller 52.

Then, the UV irradiation head 56 irradiates the supplied photocurable resin with ultraviolet rays and thus cures the photocurable resin to form the organic barrier layer. The above-described operation is performed on each of the particles.

FIG. 6 shows the inkjet head 54 and the UV irradiation head 56 as being separate from each other. Alternatively, the inkjet head 54 and the UV irradiation head 56 may be, provided as one head. An LED or a semiconductor laser element may be used as an ultraviolet light source, so that the UV irradiation device 56 is realized as a compact device including light source itself. Alternatively, the UV irradiation device 56 may include only an output end of an optical fiber and a lens unit provided when necessary. In this case, as an ultraviolet light source unit that emits ultraviolet rays toward an input end of the optical fiber, an LED, a semiconductor laser element or any of various other ultraviolet light sources (e.g., lamps such as, for example, a mercury xenon lamp, a super-high pressure mercury lamp and the like) is usable. In consideration of the combining efficiency, it is preferred to use a light source capable of oscillating laser light, for example, an LED, a semiconductor laser element or the like. In the case where the UV irradiation head 56 and an ultraviolet light source are located separately from each other, there is an advantage, that in a series of steps including the detection of a foreign object, the supply of a coating liquid and the irradiation with ultraviolet rays, the influence exerted by heat generation of the light source on the OLED 3 in the substrate 100M is decreased.

Alternatively, for example, a plurality of inkjet heads may be prepared. For example, two or more inkjet heads generating different sizes of microscopic liquid drops may be prep red, so that different inkjet heads are used for particles of different sizes.

For example, the inkjet head 54 preferably usable may generate microscopic liquid drops each having a volume of the order of 1 fL (1 fL or larger and smaller than 10 fL) or may generate microscopic liquid drops each having a volume smaller than 1 fL. 1 fL corresponds to a volume of a sphere having a diameter of about 1.2 m, and 0.1 fL corresponds to a volume of a sphere having a diameter of about 0.6 m. For example, the inkjet device, produced by SIJ Technology Inc., tint is capable of injecting 0.1 fL microscopic liquid drops (specifically, Super Inkjet (registered trademark)) is preferably usable.

Now, with reference to FIG. 7(a) and FIG. 7(b), the volume of the organic barrier layer (solid portion) to be formed in the vicinity of the particle P and a preferred size of the microscopic liquid drops used to form the organic barrier layer will be described. FIG. 7(a) and FIG. 7(b) are schematic views provided to describe a preferred range of the volume of the organic barrier layer to be formed in the vicinity of the particle P in the OLED display device according to an embodiment of the present invention. FIG. 7(a) is a cross-sectional view taken along line 7A-7A' in FIG. 7(b), and is a schematic view of a cross-section including a diameter of the particle P. FIG. 7(b) is a plan view as seen in a direction normal to the surface of the OLED 3.

Now, is assumed that the particle P or the first inorganic barrier layer 12a formed so as to cover the particle P (the particle P and the first inorganic barrier layer 12a formed so as to cover the particle P may be collectively referred to as a "protruding portion by the particle P") is spherical. An organic barrier layer 14v in the vicinity of the particle P may be formed to cover the particle P and/or the inorganic barrier layer 12a on the particle P. However, if the organic barrier layer 14 is too thick, there is, an undesirable possibility that the protruding portion by the particle P is visually recognized by a refraction function (lens effect) of the organic barrier layer 14. Therefore, it is preferred that as shown in FIG. 7(a), the organic barrier layer 14v is formed only in a region extending downward by a length corresponding to the radius R from a position corresponding to the center of the protruding portion by the particle P. The organic barrier layer 14v may be formed in this manner by adjusting the volume of the coating liquid to be supplied (in the case where the coating liquid contains a solvent, by adjusting the volume of the solid content) and/or by adjusting the aching conditions (e.g., time). Ashing will be described below.

Assuming that a concave surface of the organic barrier layer 14v is a curved surface having a radius of curvature that is the same as the radius R of the protruding portion by the particle P, the volume $V_0$ of the organic barrier layer 14v shown in FIG. 7(a) and FIG. 7(b) is represented by the following expression (1).

$$V_0 = (4-\pi)\pi R^3 \qquad (1)$$

When the radius R of the protruding portion by the particle P is 0.15 m, $V_0$ is about 0.009 fL. When the radius R is 0.25 m, $V_0$ is about 0.04 fL. When the radius R is 2.5 m, $V_0$ is about 42 fL.

It is preferred that the volume of the organic barrier layer 14v is larger than, or equal to, about ½ of Vo. If the volume of the organic barrier layer 14v is smaller than this range, there is an undesirable possibility that the effect of the formation of the organic barrier layer 14v is not provided, namely, the second inorganic barrier layer 16 with a fine film with no defect is not formed. The upper limit of the volume of the organic barrier layer 14v may be a level at which the protruding portion by the particle P is not visually recognized by the refraction function (lens effect). The upper limit preferably does not exceed five times of $V_0$, and more preferably does not exceed twice of $V_0$. In the case where the radius R of the protruding portion by the particle P is shorter than 2.5 m (in the case where $V_0$ is smaller than about 42 fL), the volume of the organic barrier layer 14v is not limited to the above-described range. The volume of the organic barrier layer 14v is merely required not to exceed about 200 fL, and is preferably smaller than, or equal to, about 100 fL.

It is preferred that the size of the microscopic liquid drops is appropriately set in accordance with the radius R of the protruding portion by the particle P. It is preferred that, for example, the size of the microscopic liquid drops is set such that one to three drops satisfy $V_0$. A solvent may be incorporated into the coating liquid, so that the microscopic liquid drops are made large (to a size range from a size larger than the final size to 10 times the original size) with respect to the solid content in the coating liquid (amount left as the organic barrier layer 14v in a final state).

A protruding portion, the particle P, having diameter shorter than 0.2 m (having a radius R shorter than 0.1 m) is considered to have substantially no influence on the moisture-resistance reliability even if the organic barrier layer 14v is not provided. Therefore, it is merely needed to detect protruding portions, by the particle P, having a diameter of 0.2 m or longer (having a radius R of 0.1 m or longer) and form the organic barrier layer 14v in corresponding portions.

It is not efficient to supply a microscopic drop of 0.1 fL, a great number of times for a particle P having a diameter of 5 m (having a radius R of 2.5 m). Therefore, for example, an inkjet head generating microscopic liquid drops smaller than 1 fL (e.g., 0.1 fL) and an inkjet head generating microscopic liquid drops of 10 fL or larger and smaller than 0.5 pL (e.g., 50 fL) may be prepared, so that one of the infect heads is selected in accordance with the size of the particle P. The UV irradiation head 56 is commonly usable. Needless to say, three or more inkjet heads generating microscopic liquid drops of different sizes may be prepared.

A coating liquid containing a photocurable resin (monomer) contains a photoinitiator (radical polymerization initiator or cationic polymerization initiator) and also a small amount of additive such as a surfactant or the like. The photocurable resin is contained in the coating liquid at a content of about 80% by mass to about 90% by mass, and the photoinitiator is contained at a content of about 5% by mass to about 10% by mass. A pigment or a dye may be incorporated into the coating liquid the case where a pigment is incorporated, dispersant may also be incorporated. A preferred viscosity is, for example, about 0.5 mPa·s or higher and 10 Pa·s or less. In the case where a dye or a pigment is incorporated, it is easily checked whether or not the organic barrier layer (solid portion) has been formed at a desired position. The pigment needs to be put into microscopic pieces, which raises the viscosity. Therefore, it is preferred to use a dye. In the case where, for example, microscopic liquid drops of 0.1 fL are generated, it is preferred that the coating liquid does not contain a pigment or a dye. In order to adjust the viscosity or the size. (volume) of the microscopic liquid drops, a solvent (e.g., an organic solvent such as alcohol or the like) may be incorporated.

Usable as the photocurable resin may be a radical polymerizable monomer containing a vinyl group such as an acrylic resin (acrylate monomer) or the like, or a cationic polymerizable monomer containing an epoxy group. An appropriate photoinitiator is selected in accordance with the type of the resin to be used and the wavelength range of the DV light to be, directed. Instead of the UV irradiation head 56, an ultraviolet irradiation device such as a high pressure mercury lamp, a super-high pressure mercury lamp or the like may be, used to, for example, irradiate the entirety of the photocurable resin on the substrate 100M with ultraviolet rays at the same time.

The production method may further include a step of partially ashing the photocured resin layer formed by curing the photocurable resin. Ashing may be performed by use, of a known plasma aching device, a known aching device using corona discharge, a known photo-excited aching device, a known UV ozone asking device or the like. Ashing may be performed, for example, by plasma aching using at least one type of gas among $N_2O$, $O_2$ and $O_3$, or by a combination of plasma ashing and ultraviolet irradiation. In the case where an SiN film is formed by CVD as each of the first inorganic barrier layer 12 and the second inorganic barrier layer 16, $N_2O$ is used as material gas. Therefore, use of $N_2O$ for ashing provides an advantage of simplifying the ashing device.

Ashing results in oxidizing the surface the organic barrier layer 14 to modify the surface the organic barrier layer 14 to hydrophilic. In addition, ashing results in shaving the surface the organic barrier layer 14 substantially uniformly and forming extremely tiny concaved and convexed portions to increase the surface area size of the organic barrier layer 14.

The effect of aching of increasing the surface area size is greater for the surface of the organic barrier layer 14 than for the surface of the first inorganic barrier layer 12 formed of an inorganic material. Since the surface of the organic barrier layer 14 is modified to be hydrophilic and the surface area size thereof is increased, the adhesiveness between the organic barrier layer 14 and the second inorganic barrier layer 16 is improved.

In order to improve the adhesiveness between the first inorganic barrier layer 12 and the organic barrier layer 14, the surface, of the first inorganic barrier layer 12 may be ached before the organic barrier layer 14 is formed.

Ashing results in, for example, removing the photocured resin layer formed on the protruding portion by the particle P to adjust the location and; or the volume of tree organic barrier layer 14 left in final state, and also results in improving the adhesiveness between the organic barrier layer 14 and the second inorganic barrier layer 16.

Embodiments of a method for producing an OLED display device including a flexible substrate, and such an OLED display device, according to an embodiment of the present invention are described above. The embodiments of the present invention are not limited to the embodiment described above as examples, and the present invention is widely applicable to an organic EL device including an organic EL element formed on a non-flexible substrate (e.g., glass substrate) and a thin film encapsulation structure formed on organic EL element (applicable to, for example, an organic EL illumination device).

INDUSTRIAL APPLICABILITY

Embodiments of the pre Sent invention are applicable to a method for producing an organic EL device and to an organic EL device. The embodiments of the present invention are especially preferably applicable to a method for producing a flexible organic EL display device and to an organic EL display device.

REFERENCE SIGNS LIST 1 flexible substrate
2 circuit (backplane)
3 OLED layer (OLED)
4 polarizing plate
10 TFE structure
12, 12a, 12b first inorganic barrier layer (SiN layer)
12c crack
14 organic barrier layer
16 second inorganic barrier layer
30 lead wire
34 portion of the lead wire
36 portion of the lead wire
38 terminal portion
40 foreign object detection device
42 controller
44 detection head
50 inkjet device
52 controller
54 inkjet head
56 UV irradiation head
100 OLED display device
P particle
R1 active region
R2 peripheral region
TSF forward tapering side sur ace portion

The invention claimed is:

1. A method for producing an organic electroluminescent device, comprising the steps of:
   preparing an element substrate including a substrate and a plurality of organic electroluminescent elements supported by the substrate; and
   forming a thin film encapsulation structure covering the plurality of organic electroluminescent elements,
   wherein the step of forming the thin film encapsulation structure includes:
      step A of forming a first inorganic barrier layer,
      step B of, after step A, detecting particles, which include a first particle having an equivalent spherical diameter of 0.2 µm or longer and shorter than 0.3 µm, below or above the first inorganic barrier layer and acquiring position information on each of the particles,
      step C0 of, after step A, ashing a surface of the first inorganic barrier layer,
      step C of, after step C0, supplying each of the particles with a microscopic liquid drop of a coating liquid containing a photocurable resin by an inkjet method based on the position information to form a concave surface of the photocurable resin surrounding each of the particles,
      step D of, after step C, irradiating the photocurable resin with ultraviolet rays and thus curing the photocurable resin to form an organic barrier layer, and
      step E of, after step D, forming a second inorganic barrier layer on the first inorganic barrier layer and the organic barrier layer, wherein
      the step C includes a step of supplying a first microscopic liquid drop having a volume of 0.1 fL or larger and smaller than 10 fL to the first particle.

2. The method of claim 1, wherein the step D further includes the step of partially ashing a photocured resin layer formed by curing the photocurable resin.

3. The method of claim 1, wherein
   the step B includes a step of detecting particles, which include the first particle and a second particle having an equivalent spherical diameter of 0.3 µm or longer and 5 µm or shorter, below or above the first inorganic barrier layer and acquiring size information on each of the particles,
   the step C includes a step of supplying a second microscopic liquid drop larger than the first microscopic liquid drop, and
   the step C including a step of selecting the first microscopic liquid drop to the first particle and selecting the second microscopic liquid drop to at least the second particle having an equivalent spherical diameter of 5 µm, based on the size information on each of the particles.

4. The method of claim 3, wherein the first microscopic liquid drop does not contain a dye or a pigment and the second microscopic liquid drop contains a dye or a pigment.

5. The method of claim 3, wherein the second microscopic liquid drop has a volume of 10 fL or larger and 0.5 pL or smaller.

* * * * *